US006591089B1

(12) United States Patent
Ichihara

(10) Patent No.: US 6,591,089 B1
(45) Date of Patent: Jul. 8, 2003

(54) MOBILE STATION WITH TRANSMISSION POWER CONTROL SYSTEM

(75) Inventor: Masaki Ichihara, Tokyo (JP)

(73) Assignee: NEC Corporation, Tokyo (JP)

( * ) Notice: Subject to any disclaimer, the term of this patent is extended or adjusted under 35 U.S.C. 154(b) by 482 days.

(21) Appl. No.: 09/661,202

(22) Filed: Sep. 13, 2000

(30) Foreign Application Priority Data

Sep. 14, 1999 (JP) .......................................... 11-259680

(51) Int. Cl.$^7$ .............................................. H04B 17/00
(52) U.S. Cl. ......................... 455/115; 455/126; 455/522
(58) Field of Search ............................. 455/115, 67.1, 455/69, 75, 133, 136, 137, 341, 522, 126

(56) References Cited

U.S. PATENT DOCUMENTS

| 5,056,109 A | 10/1991 | Gilhousen et al. | 455/69 |
| 5,193,223 A | 3/1993 | Walczak et al. | 455/115 |
| 5,732,334 A | 3/1998 | Miyake | 455/126 |
| 5,940,743 A | 8/1999 | Sunay et al. | 455/69 |

FOREIGN PATENT DOCUMENTS

EP 0 708 527 A1 4/1996

*Primary Examiner*—Thanh Cong Le
*Assistant Examiner*—Thuan T. Nguyen
(74) *Attorney, Agent, or Firm*—Sughrue Mion, PLLC

(57) ABSTRACT

The mobile station has a variable gain amplifier and adjusts a gain of the variable gain amplifier in accordance with a level data signal so as to transmit an output transmission signal for each of slots with transmission power control. The mobile station further has a compensation system for the transmission power control with respect to variance of environment surrounding to the mobile station and so on. The compensation system partially extracts the output transmission signal over each slot and carries out a logarithmic wave detection of the extracted transmission signal to produce a resultant signal of the wave detection. Then the compensation system calculates for each slot an average error of the resultant signal of the level data signal and corrects the level data signal with reference to the average error to produce a corrected level data signal as a newly level data signal. When the gain of the variable gain amplifier is adjusted according to this newly level data signal, transmission power control is compensated and the mobile station produces a gain compensated transmission signal as the output transmission signal.

30 Claims, 9 Drawing Sheets

MOBILE STATION WITH TRANSMISSION POWER CONTROL SYSTEM

BACKGROUND OF THE INVENTION

This invention relates to a mobile station with transmission power control system.

In the field of cellular telecommunications, recent techniques have been directed to Code Division Multiple Access (CDMA) system, especially to Wideband CDMA (W-CDMA) system. In a CDMA system, a base station provides a cell-site (or a short cell-site) and communicates with multiple mobile stations of users existing on the cell-site. In the cell cite, each mobile station uses a channel identified by a uniquely assigned digital code. Therefore, communications between the base station and multiple mobile stations can be simultaneously carried out while sharing the same wideband frequency spectrum.

In a CDMA cellular system, transmission power levels of the mobile stations become important. A base station simultaneously receives the signals from many different mobile stations at the same frequency. The processes of CDMA demodulation taken into account, it is necessary that the signal received at the base station from each mobile station be as close as possible to single level. Otherwise, the signal from one mobile station overwhelms the signal from another mobile station. This problem is well known as near-far problem.

To resolve the near-far problem, a transmission power control of each mobile station is carried out in a CDMA cellular system so that the signal level received at the base station from each mobile station is as close as possible to a single predetermined level. Such transmission power controls are described in U.S. Pat. No. 5,056,109 and U.S. Pat. No. 5,940,743, the descriptions thereof incorporated by reference.

A transmitter including a transmission power control system comprises a plurality of parts such as amplifiers, filters, and a local oscillator. The characteristics of parts of a transmitter may be different from ones of parts belonging to another transmitter. That is, uneven quality may exist between transmitters. Additionally, the environment surrounding to a transmitter, especially temperature, has effects on the characteristics of parts of the transmitter. The uneven quality and the temperature effect cause a predefined power control system not to control the transmission power to be desired power. Therefore, it is necessary to compensate the uneven quality and the temperature effect.

In addition, the compensation must be designed not for instantaneous power of transmission but for average power of transmission at each slot. In a CDMA system, transmission signals are subjected not only to spectrum spreading but also conventional modulation for each slot. Therefore, demodulation requires no change of gain for each slot.

However, no transmission power control system can meet the foregoing requirements for compensation in the art.

SUMMARY OF THE INVENTION

It is therefore an object of the present invention to provide a mobile station having transmission power control system which can compensate the temperature effect and so on.

According to one aspect of the present invention, a mobile station has the following structure and transmits an output transmission signal for each of slots with power control. The mobile station comprises a transmission circuit, a signal extractor, a wave detector, a level data register, an error averager and a level corrector. The transmission circuit includes a variable gain amplifier, a signal processor, and a power amplifier. The variable gain amplifier is adapted to amplify a transmission signal with a gain controlled in accordance with a control signal to produce an amplified transmission signal, while the signal processor is adapted to process the amplified transmission signal into a radio frequency (RF) signal. The power amplifier is adapted to amplify transmission power of the RF signal to produce an amplified RE signal as the output transmission signal.

The signal extractor is arranged and is adapted to partially extract the output transmission signal to produce an extracted transmission signal over each slot. The wave detector is adapted to carry out a wave detection of the extracted transmission signal to produce a resultant signal of the wave detection. The level data register is adapted to output a level data signal indicative of a default controlled level of the output transmission signal. The an error averager is adapted to calculate for each slot an average error of the resultant signal of the level data signal to produce an average error signal. The level corrector is adapted to correct the level data signal with reference to the average error signal to produce a corrected level data signal corresponding to the control signal.

With the structure, the variable gain amplifier amplifies the transmission signal with a gain controlled in accordance with the corrected level data signal, to produce a gain controlled transmission signal which is transmitted as the output transmission signal through the signal processor and the power amplifier. Thus the mobile station can transmit the transmission signal with the power control of the transmission signal compensated for environment surrounding to the mobile station.

DESCRIPTION OF THE PREFERRED EMBODIMENTS

Now, explanations will be at first made about an earlier mobile station having a transmission power control system which is known to the inventor, for the sake of understanding of the present invention.

Figure 1:
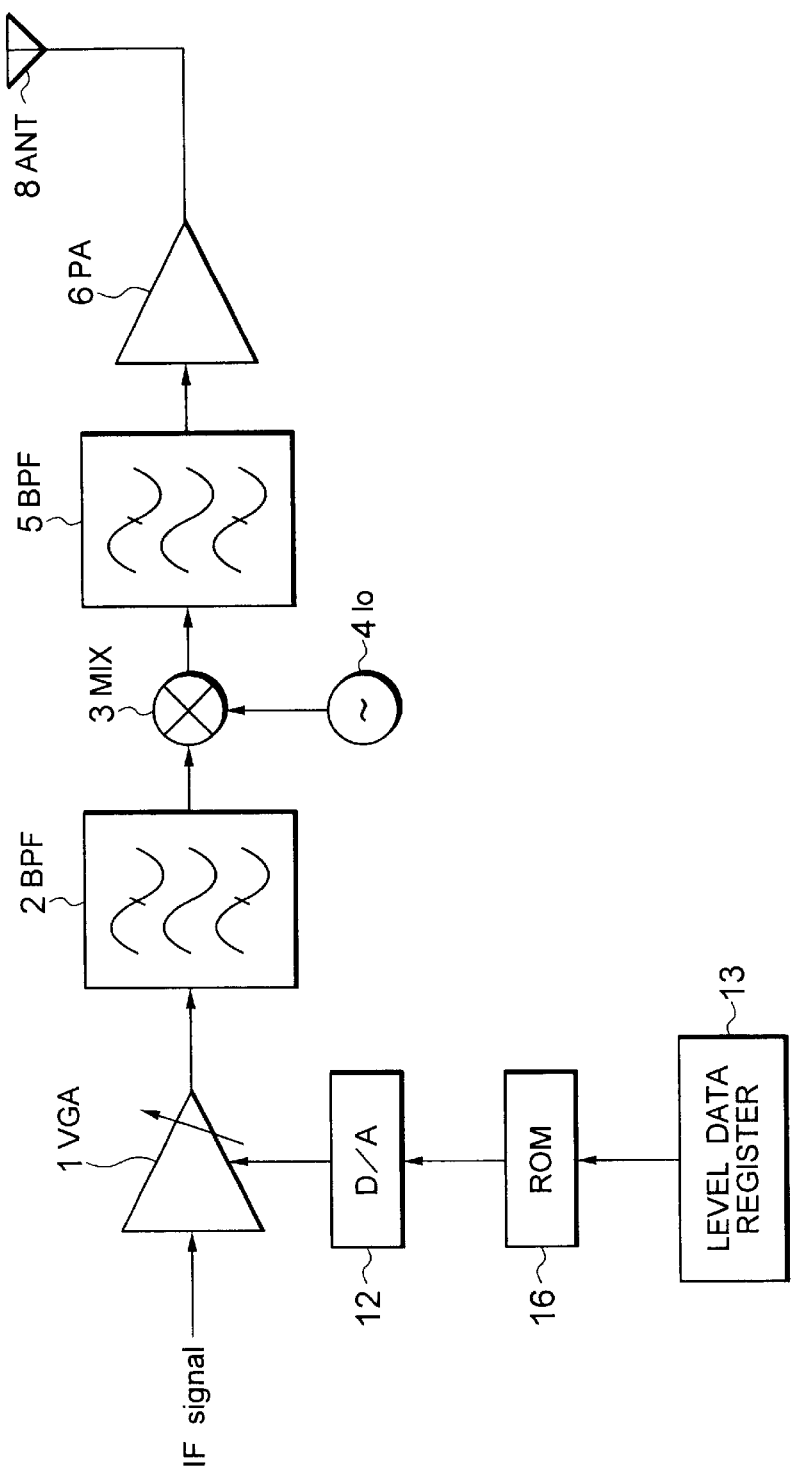
FIG. 1 is a block diagram schematically showing an earlier transmission power control system of a mobile station.

Referring to FIG. 1, the earlier mobile station comprises a CDMA (or W-CDMA) transmission system and a transmission power control system. The CDMA transmission system includes a variable gain amplifier 1, a first band pass filter 2, a mixer 3, a local oscillator 4, a second band pass filter 5, a power amplifier 6, and an antenna 8 and transmits an output transmission signal to a base station. The transmission power control system comprises a D/A converter 12, a ROM table 16, and a level data register 13 and controls the power of the output transmission signal by adjusting the gain of the variable gain amplifier 1. In the followings, signal processing of the transmission system will be mentioned and then a controlling approach of the transmission power control system will be described.

In the CDMA transmission system, an intermediate frequency (IF) signal is generated as a result of spectrum spreading and other processing and is input into the variable gain amplifier 1. The variable gain amplifier 1 amplifies the IF signal to deliver an amplified IF signal to the first band pass filter 2. Responsive to the amplified IF signal, the first band pass filter 2 filters a first band width component of the amplified IF signal to produce a first filtered signal which is delivered into the mixer 3. The mixer 3 also receives a local frequency signal from the local oscillator 4 and mixes the first filtered signal and the local frequency signal so that the first filtered signal is changed into a radio frequency (RF) signal and is delivered to the second band pass filter 5. The RF signal includes a surplus component owing to the mixing process of the mixer 3. The second band pass filter 5 filters a second band width component of the RF signal so as to removes the surplus component and to input a second filtered signal into the power amplifier 6. The power amplifier 6 amplifies the power of the second filtered signal and transmits a power amplified signal as an output transmission signal through the antenna 8. The transmission system may comprise a driver amplifier prior to the power amplifier 6.

In the above-mentioned transmission system, the power $P_{TX}$ of the transmission signal is expressed by the following equation:

$$P_{TX} = P_{IF} + G_V + L_{F1} + G_C + L_{F2} + G_{PA} + L_A$$

where $P_{IF}$ represents a level of the IF signal, $G_V$ represents a gain of the variable gain amplifier 1, $L_{F1}$ represents a loss occurred in the first band pass filter 2, $G_C$ represents a conversion gain given by the mixer 3, $L_{F2}$ represents a loss occurred in the second band pass filter 5, and $L_A$ represents a loss occurred in the antenna 8 and other peripheral devices. In addition, each of the terms of the equation has dB as its order. Among them, $L_{F1}$, $L_{F2}$, and $L_A$ have negative values.

The transmission power control system gives a control signal to the variable gain amplifier 1 and adjusts the gain $G_V$ of the right side of the foregoing equation so as to control the power $P_{TX}$.

In detail, a controller, which comprises for example a CPU and is not shown, writes a level data into a level data register 13. The level data is of data corresponding to a desired output level (or a default controlled level) of the transmission signal. The level data is input as a level data signal into the ROM table 16. The ROM table 16 is arranged and adapted to correct a non-linear part of the characteristic which is of the variable gain amplifier 1 with respect to a relationship between a gain thereof and a control signal input thereinto. The output signal of the ROM table that is a digital signal is converted into the control signal as an analog signal by the D/A converter 12. The control signal is input into a control terminal of the variable gain amplifier 1 so as to control the gain $G_V$ of the variable gain amplifier 1. Thus the gain $G_V$ is controlled so that the power $P_{TX}$ is also controlled.

Figure 2:
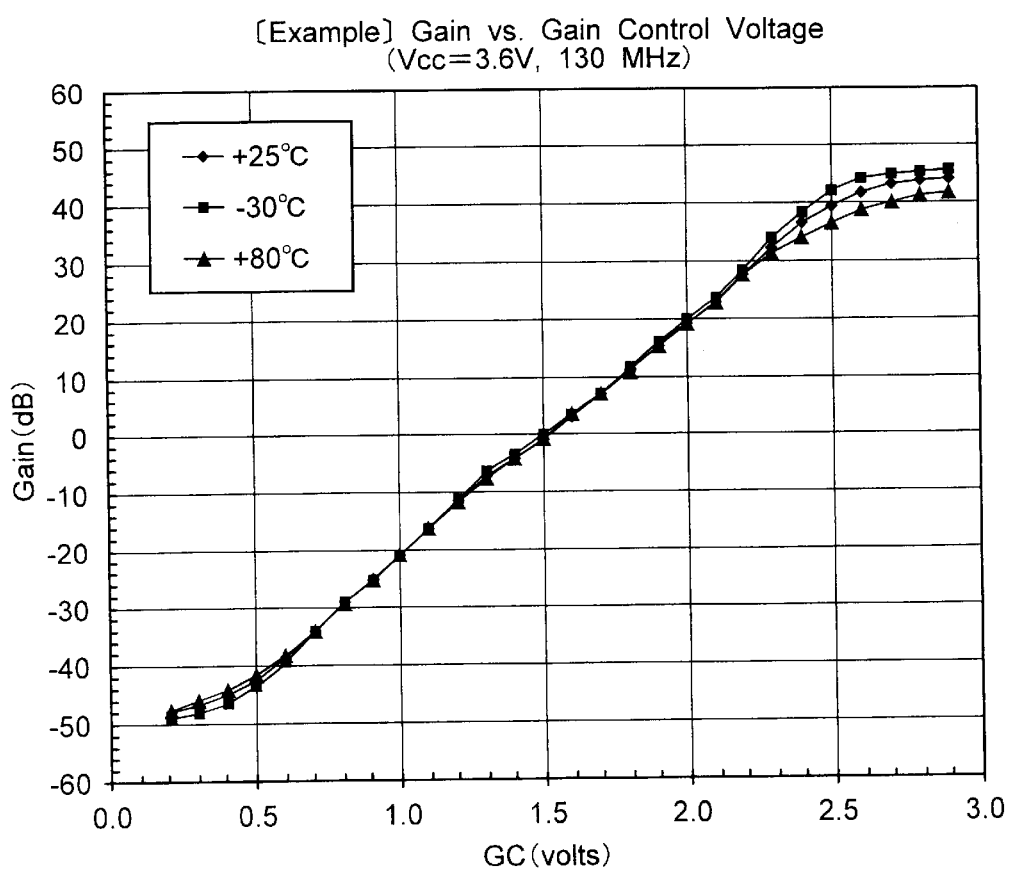
FIG. 2 is a graph showing a relationship between a gain and a gain control voltage in an exemplary variable gain amplifier.

There is, however, a fluctuation in the level $P_{IF}$ of the IF signal corresponding to variance of temperature. In addition, the gain $G_V$ of the variable gain amplifier 1 changes depending upon the variance of temperature. For example, in case of a variable gain amplifier known to the inventor, there is ±3 dB in change of the gain in accordance with the maximum gain or its closer gain of the known variable gain amplifier, as shown in FIG. 2. Also, central frequencies of the first and the second filters 2 and 5 are varied according to the temperature surrounding thereto so that the losses occurred in the filters change. The mixer 3 and the power amplifier 6 also do. Those variance of the characteristics of the every units invite as a whole a large error of the power of the transmission signal. In the exemplary power control system known to the inventor, the error of the transmission power reaches ±10 dB. The large error causes a hard problem such as an interference in another cell-site or the like.

Figure 3:
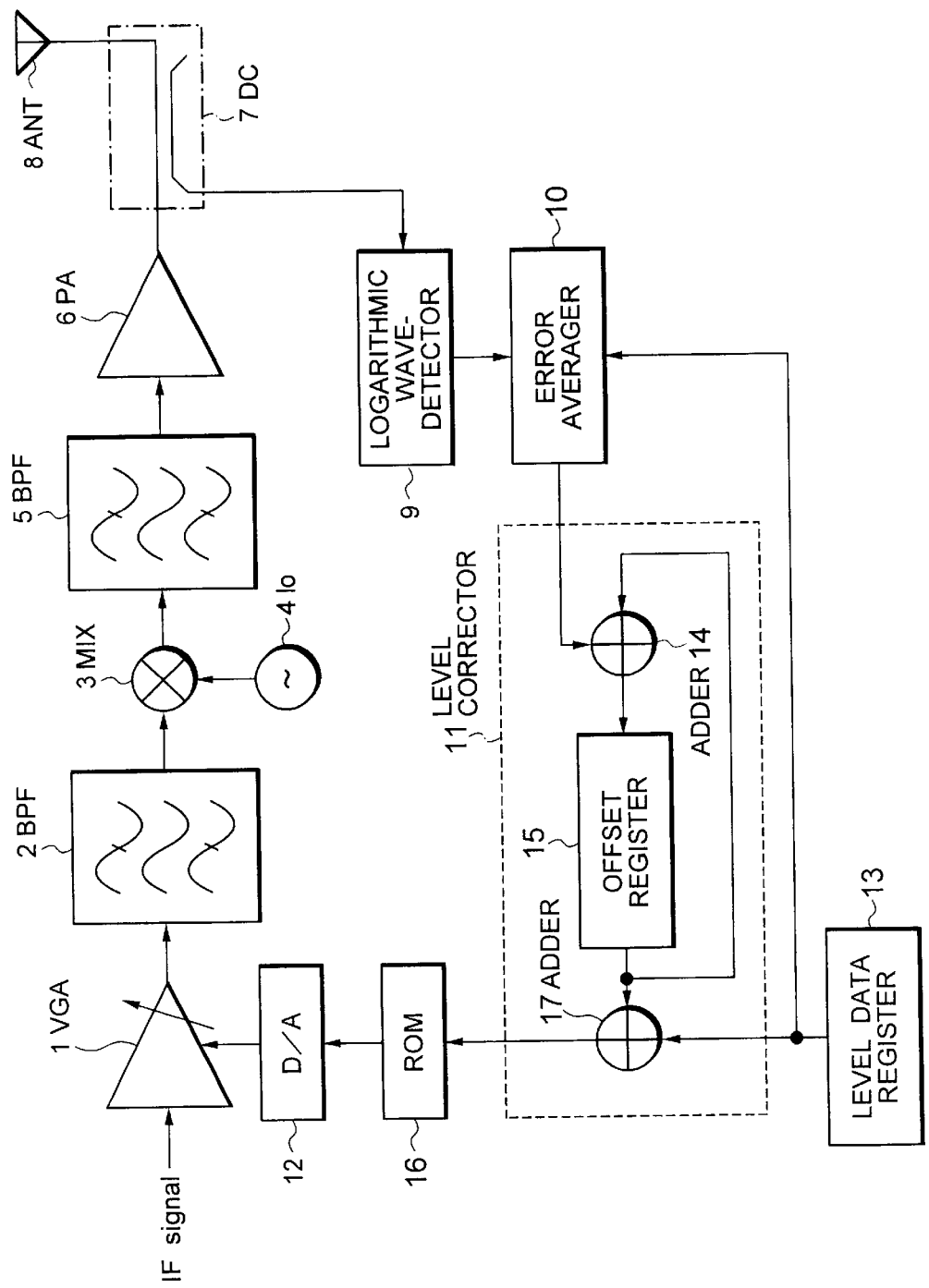
FIG. 3 is a block diagram schematically showing a transmission power control system of a mobile station according to an embodiment of the present invention.

Referring now to FIG. 3, a mobile station according to an exemplary embodiment of the present invention comprises a compensation system in addition to the transmission system and the transmission power control system of the foregoing earlier mobile station. The compensation system provides a feedback control of the transmission power, and comprises a signal extractor, a wave detector, an error averager 10 and a level corrector 11. This exemplary embodiment uses an IF signal as an input to the VGA 1, but it is understood by those skilled in the art that other types of input signals (i.e., baseband, etc.) could be input into the VGA 1 as well.

In this embodiment, the signal extractor comprise a directional coupler 7. The directional coupler 7 partially extracts the output transmission signal to be transmitted from the power amplifier 6 through the antenna 8 to the base station, and produces an extracted transmission signal over each slot. The extracted transmission signal is delivered to the wave detector.

Figure 4:
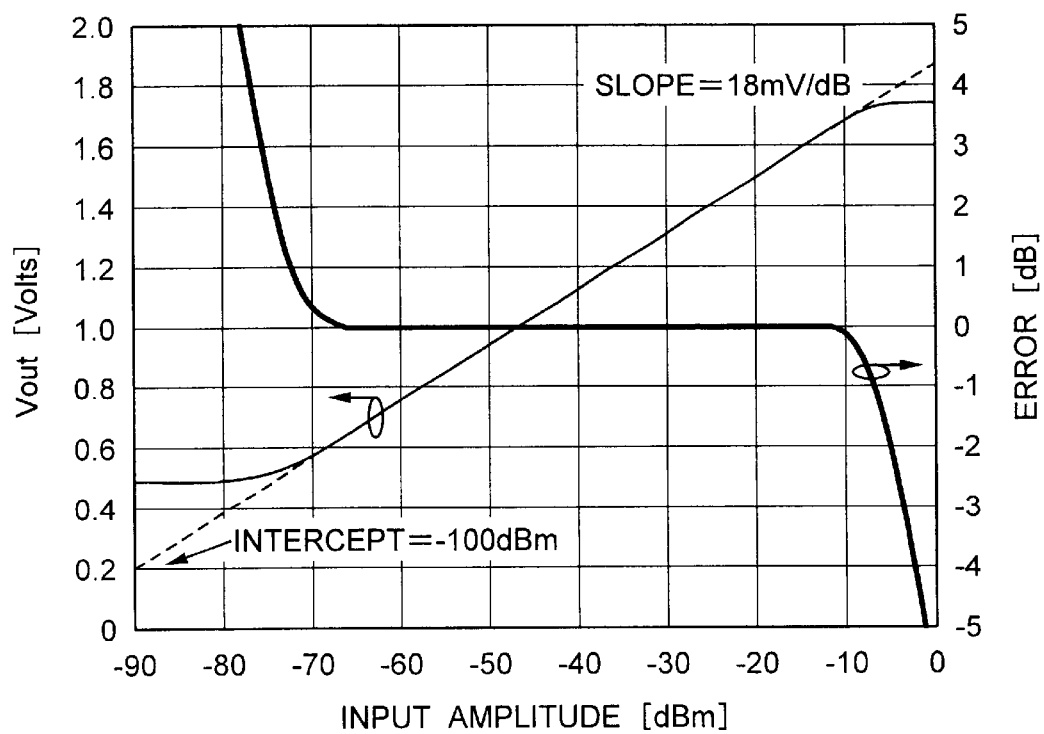
FIG. 4 is a graph showing a relationship between an input level and a wave-detected level in an exemplary logarithmic wave detector.

The illustrated wave detector comprises a logarithmic wave detector 9. Responsive to the extracted transmission signal, the logarithmic wave detector 9 carries out a logarithmic wave detection of the extracted transmission signal. The logarithmic wave detection results in a resultant signal which linearly changes corresponding to a decibel value of the extracted transmission signal level. The characteristic of an exemplary logarithmic wave detector is shown in FIG. 4. The exemplary logarithmic wave detector has 70 dB of its dynamic range. In the characteristic, a slope equals to 18 mV/dB and an intercept point is −100 dBm. Herein, the intercept point indicates an input level which theoretically causes the resultant signal to be zero volt, but actually the intercept point is not available because of various noise. These characteristic values have a very small change depending upon variance of temperature.

The resultant signal of the wave detection is delivered to the error averager 10. The level data signal, which indicates a default controlled level of the transmission signal as mentioned above, is also deliver to the error averager 10 from the level data register 13. Responsive to the resultant signal and the level data signal, the error averager 10 calculates for each slot an average error of the resultant signal of the level data signal so as to produce an average error signal.

Figure 5:
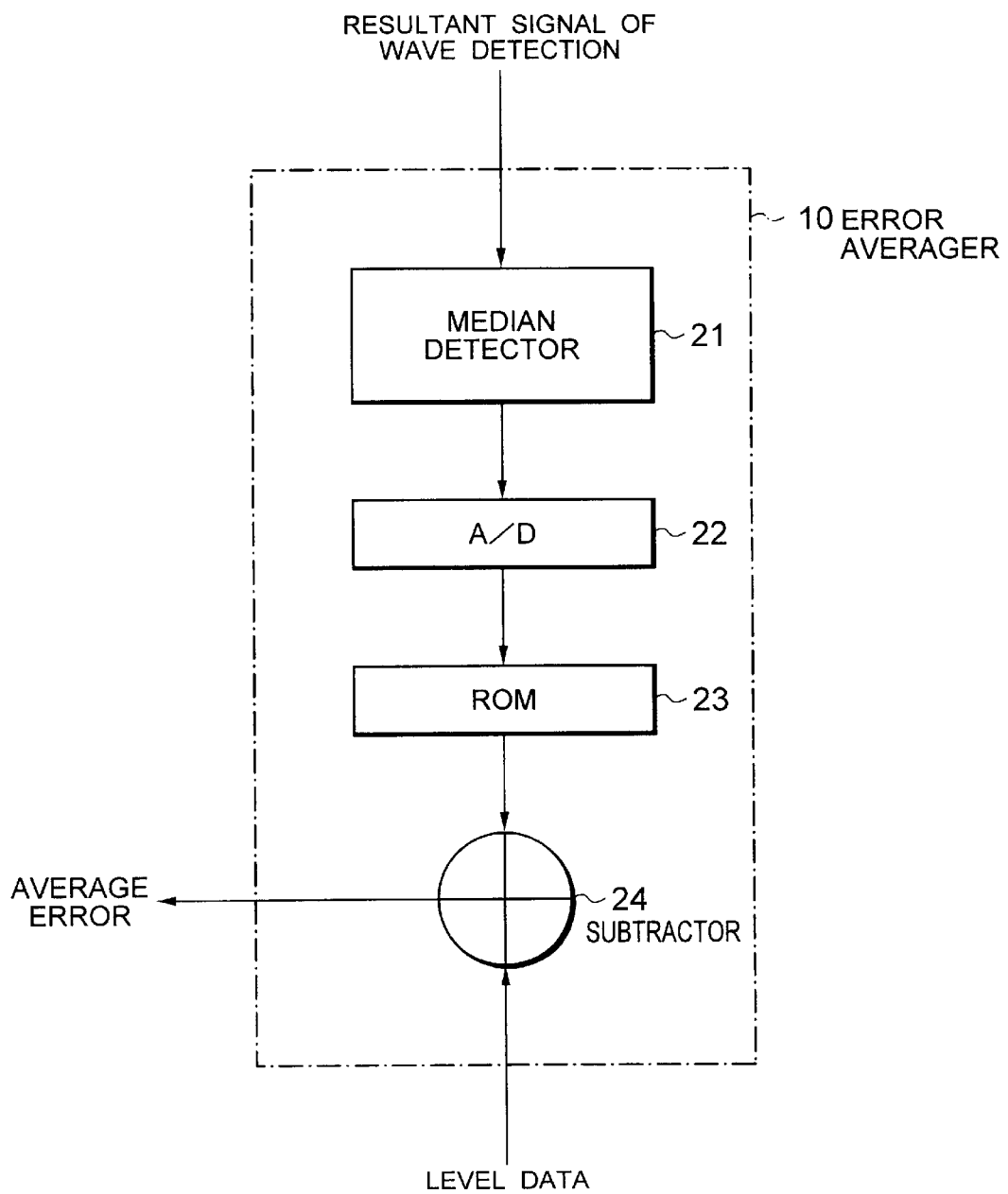
FIG. 5 is a block diagram schematically showing an error averager according to an embodiment of the present invention.

Referring to FIG. 5, the illustrated error averager 10 comprises a level averager, an A/D converter 22, an additional ROM table 23, and a subtractor 24. The level averager averages the resultant signal for each slot and thereby produces an average resultant signal having an average level of the resultant signal. In this embodiment, the level averager comprises a median detector 21 which is for detecting a median level of the resultant signal for each slot to produce a median signal as the average resultant signal.

Figure 6:
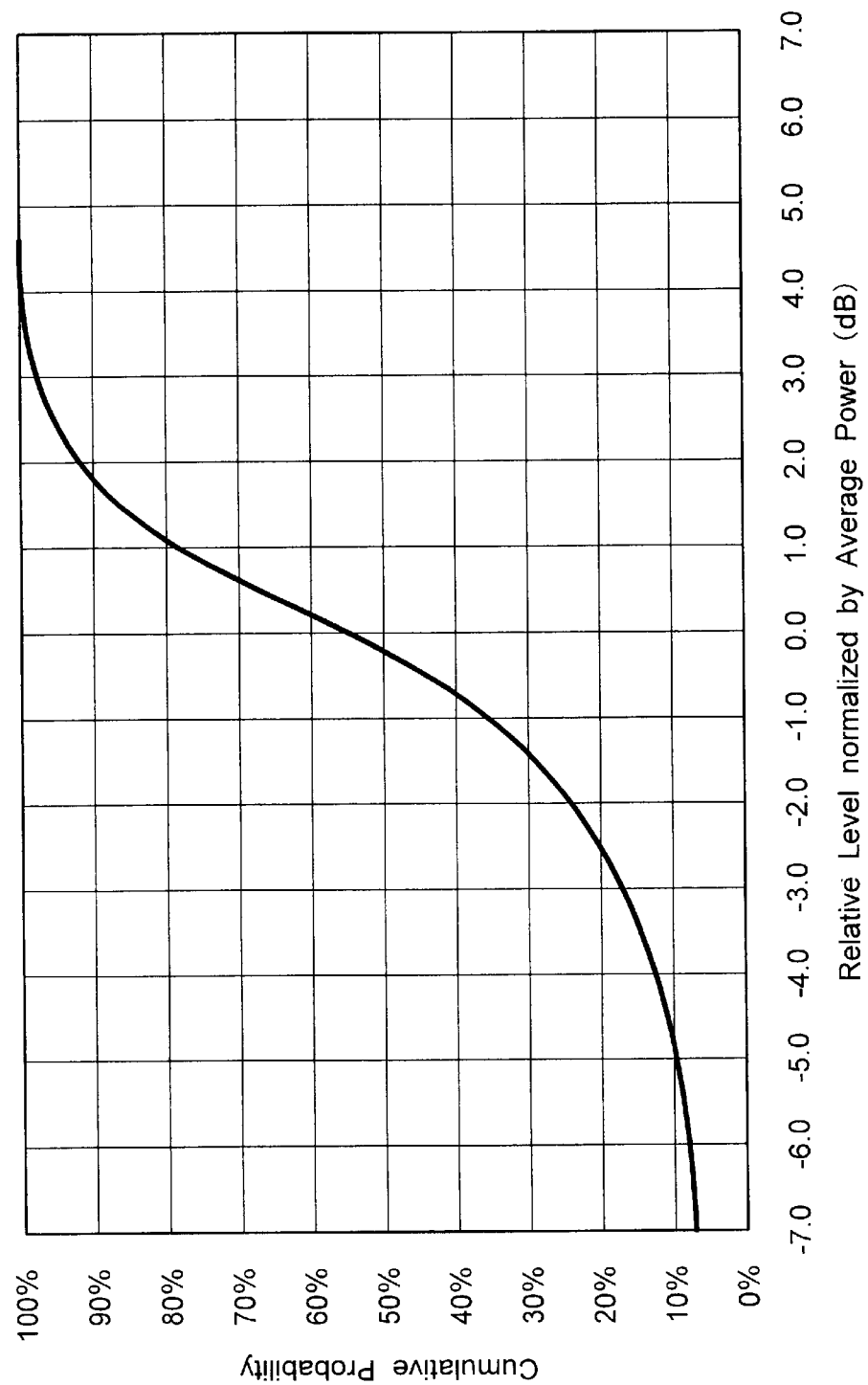
FIG. 6 is a graph showing a cumulative probability distribution with respect to normalized level of the transmission power in a case of an exemplary QPSK (Quadrature Phase Shift Keying) modulation system where a rolloff is 0.22.

Referring now to FIG. 6, the median and the median signal are explained in detail. The illustrated graph relates to an exemplary QPSK (Quadrature Phase Shift Keying) modulation system where a rolloff is 0.22. In the illustrated graph, the abscissa represents a normalized level relative to the average transmission power, where the average transmission power has 0 dB, while the ordinate represents a cumulative probability that the instantaneous intensity of the transmission signal exceed a certain relative level. Herein, the median indicates a level which gives 50% of the cumulative probability.

As understood from FIG. 6, the difference between the median and the average transmission power is very small. Concretely, the median is smaller than the average transmission power and the difference is about 0.2 dB. In actual, the median can be used instead of the average transmission power. In addition, although the difference depends upon what kind of modulation is adopted, the difference is fixed if the adopted modulation is identified. It is therefore easy to calculate the average transmission power on the basis of the median if necessary. The calculation is addition of the fixed difference to the median.

Figure 7:
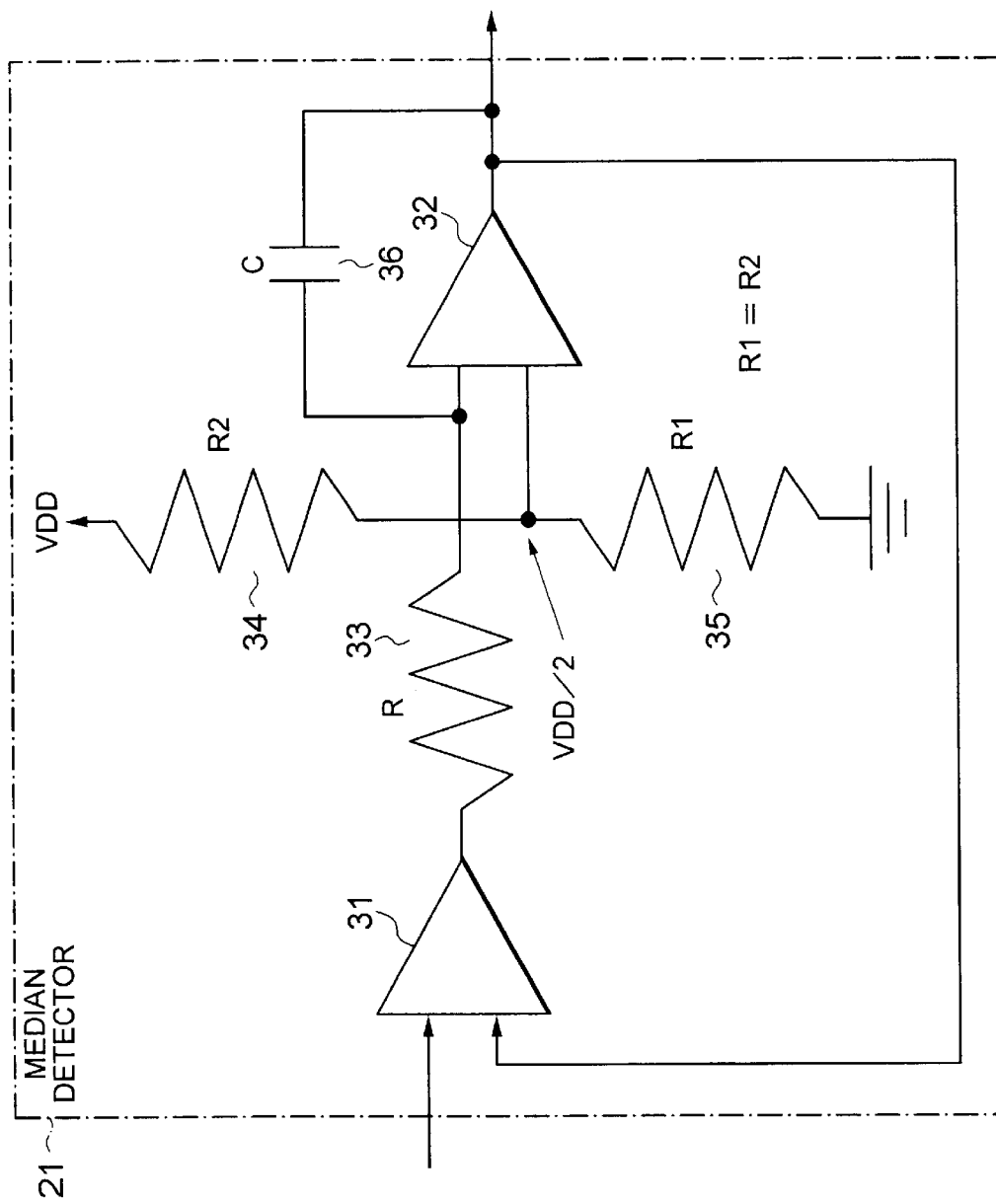
FIG. 7 is a circuit diagram showing an example of median detector.

Referring to FIG. 7, the median detector 21 comprises a comparator 31, a voltage supplier (34, 35), and an integrator (32, 33, 36). The comparator 31 compares the resultant signal and an output signal of the integrator (32, 33, 36) to produce a compared signal. The compared signal is supplied to a resistor 33 as a negative input terminal of the integrator. The voltage supplier supplies to a positive terminal of the integrator with a reference voltage equal to a half voltage of power source VDD included in the mobile station. In this embodiment, the voltage supplier comprises a voltage divider consisting of two resistors 34 and 35 which have the same characteristic. As the reference voltage is given to the positive terminal, the integrator integrates a voltage of the compared signal which alternatively changes with respect to the reference voltage. Thus the integrator produces an integrated signal as the median signal, namely the average resultant signal which is an analog signal.

Turning to FIG. 5, the average resultant signal is changed into a digital signal by the A/D converter 22 and is given to the additional ROM table 23. For example, the A/D converter 22 arranged after the median detector 21 may be a serial A/D converter because high conversion rate is not required.

The additional ROM table 23 adapted to correct a non-linear part of the characteristic of the logarithmic wave detector 9. The additional ROM table 23 may be omitted if the characteristic of the logarithmic wave detector 9 is allowable for a design of the compensation system.

Responsive to the output of the additional ROM table 23, the subtractor 24 subtracts the output of the additional ROM table 23 from the default controlled level indicated by the level data signal, and thereby, produce the average error signal.

Turning now to FIG. 3, the level corrector 11 corrects the level data signal with reference to the average error signal to produce a corrected level data signal. The illustrated level corrector 11 comprises an offset register 15 and first and second adders 14 and 17. The offset register 15 stores an offset data to be output as an offset data signal. The first adder 14 adds the average error signal and a preceding one of the offset data signal to update the offset data stored in the offset register 15. The second adder 17 adds the offset data signal and the level data signal of the level data register to produce the corrected level data signal. The corrected level data signal is delivered to the ROM table 16, instead of the level data signal.

Then the ROM table 16 corrects a non-linear part of the characteristic of the variable gain amplifier 1 with respect to a relationship between a gain of the variable gain amplifier 1 and the corrected level data signal input into the variable gain amplifier 1. The output signal of the ROM table is converted into an analog signal and then is input as a newly control signal into the variable gain amplifier 1. The variable gain amplifier 1 amplifies the IF signal with a gain controlled in accordance with the corrected level data signal to produce a gain controlled IF signal. The gain controlled IF signal is transmitted as the output transmission signal through the first and second filters 2 and 5, the power amplifier 6, and the antenna 8.

Figure 8:
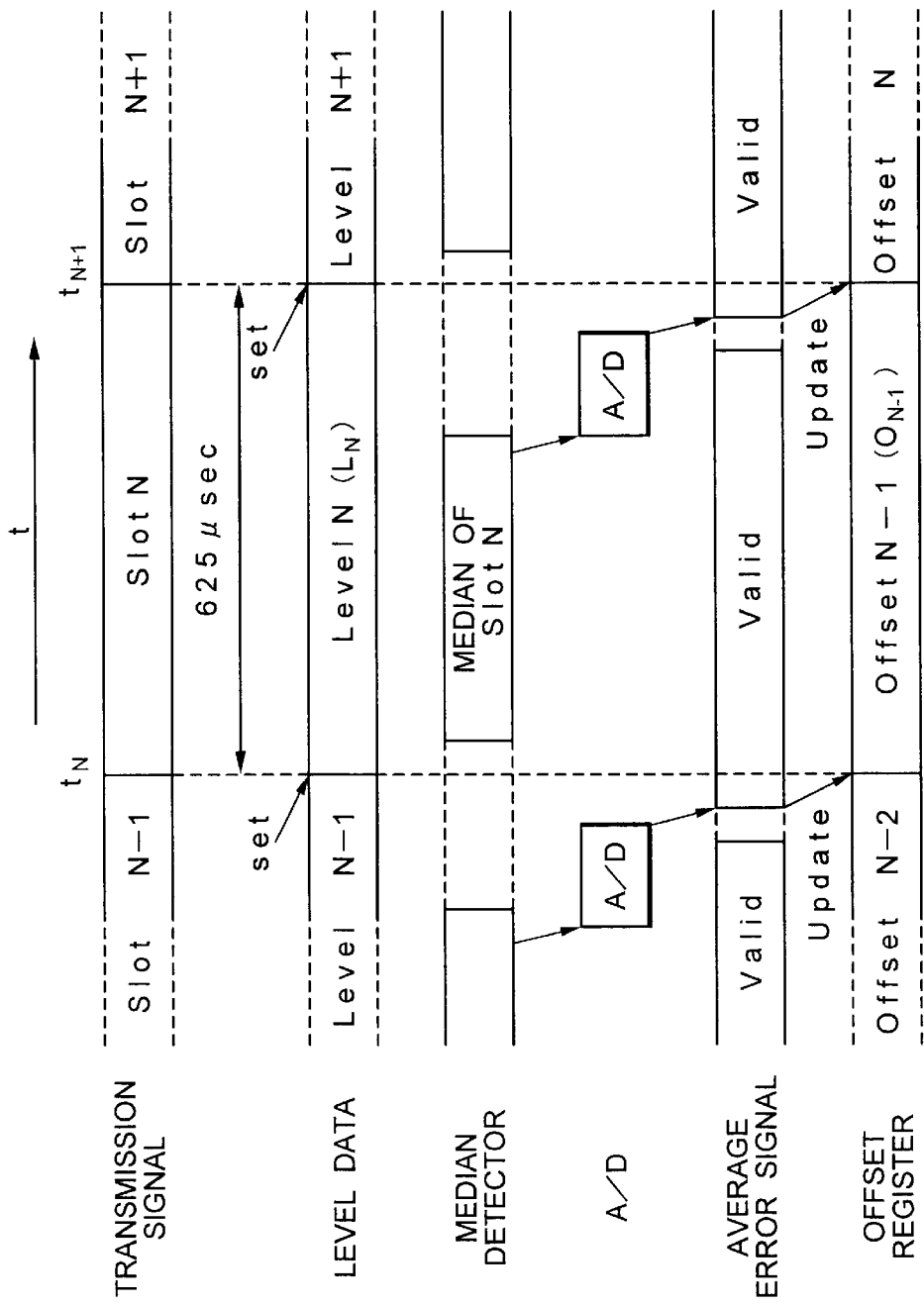
FIG. 8 is a time chart showing an operation of the transmission power control in a mobile station according to an embodiment of the present invention.

Referring to FIG. 8, the operation with the above-mentioned structure is shown as a time chart. Each of the transmission signal is transmitted in the form of "slot" which is 625 μs in time and which is for W-CDMA, as shown in the uppermost row of FIG. 8. A part of each transmission signal is extracted by the directional coupler 7 and delivered as the extracted transmission signal into the logarithmic wave detector 9. The logarithmic wave detector 9 carried out the logarithmic wave detection for the extracted transmission signal and then outputs the resultant signal of the logarithmic wave detection into the median detector 21 of the error averager 10.

As shown in second row of the FIG. 8, the level data bits are set into the level data register 13 by the controller (not shown). In this embodiment, the timing of data setting is carried out at the boundary between slots. The level data is delivered as the level data signal for the error averager 10.

The median detector 21 of the error averager 10 detects the median of the resultant signal of the logarithmic wave detection, as shown in third row. In this embodiment, the wave detection is carried out with a sufficient time such as ⅔ of one slot and results in the median signal. The median signal is an analog signal as mentioned above, and is converted into a digital signal by the A/D converter 22, as shown in fourth row. As understood from FIG. 8, the A/D conversion is also carried out with a sufficient time such as ⅕ of one slot. Therefore the A/D converter 22 may be a serial A/D converter.

The digital signal of the median is supplied to the subtractor 24 through the additional ROM table 23, while the level data signal is input into the subtractor 24. Responsive to the digital signal of the median and the level data signal, the subtractor 24 subtracts the digital signal of the median from the level data signal to the average error signal as shown in fifth row of the FIG. 8. Referring to the fifth row, the valid parts of the average error signals follow the respective resultants of the A/D conversion so as to appear intermittently. Specifically, the valid part of the average error is obtained before the next slot comes. According to the valid part of the average error, the offset data stored in the offset register 15 is updated at the same time when the next slot comes, as shown in lowest row. The updated offset data contributes to the power control for the next slot. Thus the transmission power of one slot is feed back into the control of the transmission power of next slot in this embodiment.

Figure 9:
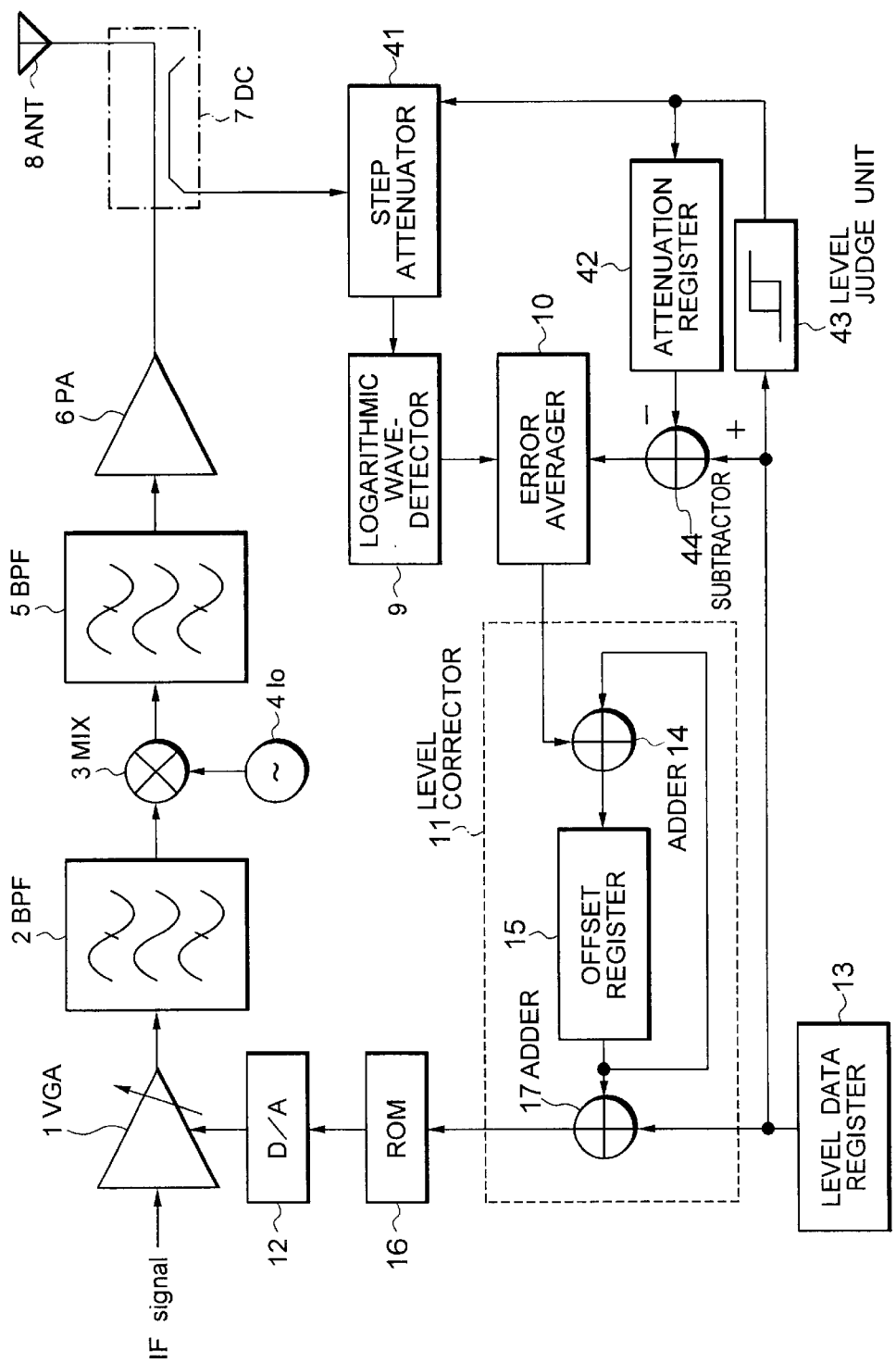
FIG. 9 is a block diagram schematically showing a transmission power control system of a mobile station according to another embodiment of the present invention.

Now, the description will be made about the modification of the above-mentioned embodiment with reference to FIG. 9.

In the modification, the compensation system of the mobile station further comprises a step attenuator 41, an attenuation register 42, a level judge unit and a subtractor 44 to widen a dynamic range of the compensation system.

The level judge unit 43 holds a predetermined threshold level and judges whether or not the level data of the level data signal exceeds the threshold level. For example, the threshold level is 10 dBm. Then the level judge unit 43 produces the attenuation control signal indicative of "1" if the level data is larger than 10 dBm. Otherwise, the level judge unit 43 produces the attenuation control signal indicative of "0." The attenuation control signal is delivered to the step attenuator 41 and the attenuation register 42.

The step attenuator 41 can change its attenuation step by step, in accordance with the attenuation control signal. For example, the attenuation in the step attenuator 41 is 20 dB if the attenuation control signal indicates "1," while being 0 dB if the attenuation control signal indicates "0."

In addition, the step attenuator 41 attenuates the extracted transmission signal delivered from the directional coupler 7 with the attenuation according to the attenuation control signal as mentioned above. As a result, the extracted transmission signal is for example attenuated with 20 dB by the step attenuator 41 if the attenuation control signal indicates "1", while passing through the step attenuator 41 without attenuation if the attenuation control signal is "0."

On the other hand, the attenuation register 42 stores the attenuation data sets each corresponding to the attenuation of the step attenuator 41. The attenuation register 42 outputs the attenuation data sets in accordance with the respective attenuation control signals. For example, the attenuation register 42 outputs the attenuation data set indicative of 20 dB if the attenuation control signal is "1", while outputting the attenuation data set indicative of 0 dB if the attenuation control signal is "0." The attenuation data set is delivered to the subtractor 44 and is subtracted from the level data by the subtractor 44. The subtraction is for adjusting the level data supplied to the error averager 10 in accordance with the attenuation which effects on the resultant signal of the logarithmic wave detection. With the above-mentioned modification, the dynamic range of the compensation system is widened with the adjustable attenuation.

While the invention has been particularly shown and described with respect to preferred embodiments thereof, it will be understood by those skilled in the art that changes in form and details may be made therein without departing from the scope and spirit of the invention. For example, although the median is detected from the resultant signal of the wave detection and then is converted into a digital signal, in the abovementioned description, the resultant signal is converted into a digital signal and then the median is detected from the digital signal. In this event, the median detection becomes digital signal processing. In the above-mentioned modification, the level judge unit may hold two threshold levels to carry out a hysteretic level judgement. In this embodiment, the hysteretic level judgement prevents the surplus fluctuation of the attenuation control signal from occurring in a point close to one threshold level, in comparison with one threshold level.

What is claimed is:

1. A mobile station which transmits an output transmission signal for each of slots with power control, the mobile station comprising:

a transmission circuit including a variable gain amplifier, a signal processor, and a power amplifier, the variable gain amplifier being adapted to amplify an intermediate frequency (IF) signal with a gain controlled in accordance with a control signal to produce an amplified IF signal, while the signal processor is adapted to process the amplified IF signal into a radio frequency (RF) signal, the power amplifier being adapted to amplify transmission power of the RF signal to produce an amplified RF signal as the output transmission signal;

a signal extractor arranged and adapted to partially extract the output transmission signal to produce an extracted transmission signal over each slot;

a wave detector adapted to carry out a wave detection of the extracted transmission signal to produce a resultant signal of the wave detection;

a level data register adapted to output a level data signal indicative of a default controlled level of the output transmission signal;

an error averager adapted to calculate for each slot an average error of the resultant signal of the level data signal to produce an average error signal; and a level corrector adapted to correct the level data signal with reference to the average error signal to produce a corrected level data signal corresponding to the control signal so that the variable gain amplifier amplifies, as a gain controlled IF signal, the IF signal with a gain controlled in accordance with the corrected level data signal, said gain controlled IF signal being transmitted as the output transmission signal through the signal processor and the power amplifier.

2. A mobile station as claimed in claim 1, wherein the signal extractor comprises a directional coupler.

3. A mobile station as claimed in claim 1, wherein the wave detector comprises a logarithmic wave detector.

4. A mobile station as claimed in claim 1, wherein the error averager comprises:

a level averager adapted to average the resultant signal for each slot to produce an average resultant signal having an average level of the resultant signal; and a subtractor, responsive to the average resultant signal, adapted to subtract the average level from the default controlled level to produce the average error signal.

5. A mobile station as claimed in claim 4, wherein the level averager comprises a median detector adapted to detect a median level of the resultant signal for each slot to produce a median signal as the average resultant signal.

6. A mobile station as claimed in claim 5, wherein the median detector comprises a comparator, a voltage supplier, and an integrator, the comparator being adapted to compare the resultant signal and an output signal of the integrator to produce a compared signal, the voltage supplier being adapted to supply a reference voltage equal to a half voltage of power source included in the mobile station, the integrator being adapted to integrate a voltage of the compared signal which alternatively changes with respect to the reference voltage, to produce an integrated signal as the median signal.

7. A mobile station as claimed in claim 6, wherein the voltage supplier comprises a voltage divider.

8. A mobile station as claimed in claim 1, wherein the level corrector comprises an offset register and first and second adders, the offset register adapted to store an offset data to be output as an offset data signal, the first adder adapted to add the average error signal and a preceding one of the offset data signal to update the offset data stored in the offset register, the second adder adapted to add the offset data signal and the level data signal of the level data register to produce the corrected level data signal.

9. A method of compensating for a transmission power control of a mobile station which has a variable gain amplifier and which transmits an output transmission signal for each of slots with power control by adjusting a gain of the variable gain amplifier in accordance with a level data signal, the method comprising:

partially extracting the output transmission signal to produce a extracted transmission signal over each slot;

carrying out a wave detection of the extracted transmission signal to produce a resultant signal of the wave detection;

calculating for each slot an average error of the resultant signal of the level data signal;

correcting the level data signal with reference to the average error to produce a corrected level data signal as a newly level data signal; and adjusting the gain of the variable gain amplifier according to the newly level data signal to compensate for the transmission power control and to produce a gain compensated transmission signal as the output transmission signal.

10. A compensation method as claimed in claim 9, wherein the carrying out uses a logarithmic wave detector for the wave detection.

11. A compensation method as claimed in claim 9, wherein the calculating comprises:

detecting a median level of the resultant signal for each slot to produce a median signal; and subtracting the median level from the level data signal to obtain the average error.

12. A mobile station which transmits an output transmission signal for each of slots with power control, the mobile station comprising:

a transmission circuit including a variable gain amplifier, a signal processor, and a power amplifier, the variable gain amplifier being adapted to amplify a transmission signal with a gain controlled in accordance with a control signal to produce an amplified transmission signal, while the signal processor is adapted to process the amplified transmission signal into a radio frequency (RF) signal, the power amplifier being adapted to amplify transmission power of the RF signal to produce an amplified RF signal as the output transmission signal;

a signal extractor arranged and adapted to partially extract the output transmission signal to produce an extracted transmission signal over each slot;

a wave detector adapted to carry out a wave detection of the extracted transmission signal to produce a resultant signal of the wave detection;

a level data register adapted to output a level data signal indicative of a default controlled level of the output transmission signal;

an error averager adapted to calculate for each slot an average error of the resultant signal of the level data signal to produce an average error signal; and a level corrector adapted to correct the level data signal with reference to the average error signal to produce a corrected level data signal corresponding to the control signal so that the variable gain amplifier amplifies the transmission signal with a gain that is controlled in accordance with the corrected level data signal prior to the amplified transmission signal being input to the signal processor and the power amplifier.

13. A mobile station as claimed in claim 12, wherein the signal extractor comprises a directional coupler.

14. A mobile station as claimed in claim 12, wherein the wave detector comprises a logarithmic wave detector.

15. A mobile station as claimed in claim 12, wherein the error averager comprises:

a level averager adapted to average the resultant signal for each slot to produce an average resultant signal having an average level of the resultant signal; and a subtractor, responsive to the average resultant signal, adapted to subtract the average level from the default controlled level to produce the average error signal.

16. A mobile station as claimed in claim 15, wherein the level averager comprises a median detector adapted to detect a median level of the resultant signal for each slot to produce a median signal as the average resultant signal.

17. A mobile station as claimed in claim 16, wherein the median detector comprises a comparator, a voltage supplier, and an integrator, the comparator being adapted to compare the resultant signal and an output signal of the integrator to produce a compared signal, the voltage supplier being adapted to supply a reference voltage equal to a half voltage of power source included in the mobile station, the integrator being adapted to integrate a voltage of the compared signal which alternatively changes with respect to the reference voltage, to produce an integrated signal as the median signal.

18. A mobile station as claimed in claim 17, wherein the voltage supplier comprises a voltage divider.

19. A mobile station as claimed in claim 12, wherein the level corrector comprises an offset register and first and second adders, the offset register adapted to store an offset data to be output as an offset data signal, the first adder adapted to add the average error signal and a preceding one of the offset data signal to update the offset data stored in the offset register, the second adder adapted to add the offset data signal and the level data signal of the level data register to produce the corrected level data signal.

20. A mobile station which transmits an output transmission signal for each of slots with power control, the mobile station comprising:

a transmission circuit comprising a signal input, a signal output and a gain control input, wherein the transmission circuit receives an input signal at the signal input, outputs an output transmission signal at the signal output and receives a gain control signal that the gain control input;

a signal extractor arranged and adapted to partially extract the output transmission signal to produce an extracted transmission signal over each slot;

a wave detector adapted to carry out a wave detection of the extracted transmission signal to produce a resultant signal of the wave detection;

a level data register adapted to output a level data signal indicative of a default controlled level of the output transmission signal;

an error averager adapted to calculate for each slot an average error of the resultant signal of the level data signal to produce an average error signal; and a level corrector adapted to correct the level data signal with reference to the average error signal to produce a corrected level data signal corresponding to the gain control signal so that the transmission circuit amplifies the input signal.

21. A mobile station as claimed in claim 20, wherein the signal extractor comprises a directional coupler.

22. A mobile station as claimed in claim 20, wherein the wave detector comprises a logarithmic wave detector.

23. A mobile station as claimed in claim 20, wherein the error averager comprises:

a level averager adapted to average the resultant signal for each slot to produce an average resultant signal having an average level of the resultant signal; and a subtractor, responsive to the average resultant signal, adapted to subtract the average level from the default controlled level to produce the average error signal.

24. A mobile station as claimed in claim 23, wherein the level averager comprises a median detector adapted to detect a median level of the resultant signal for each slot to produce a median signal as the average resultant signal.

25. A mobile station as claimed in claim 24, wherein the median detector comprises a comparator, a voltage supplier, and an integrator, the comparator being adapted to compare the resultant signal and an output signal of the integrator to produce a compared signal, the voltage supplier being adapted to supply a reference voltage equal to a half voltage of power source included in the mobile station, the integrator being adapted to integrate a voltage of the compared signal which alternatively changes with respect to the reference voltage, to produce an integrated signal as the median signal.

26. A mobile station as claimed in claim 25, wherein the voltage supplier comprises a voltage divider.

27. A mobile station as claimed in claim 12, wherein the level corrector comprises an offset register and first and second adders, the offset register adapted to store an offset data to be output as an offset data signal, the first adder adapted to add the average error signal and a preceding one of the offset data signal to update the offset data stored in the offset register, the second adder adapted to add the offset data signal and the level data signal of the level data register to produce the corrected level data signal.

28. A method of compensating for transmission power in a mobile station having a transmitter that produces an output transmission signal for a plurality of slots, the method comprising:

partially extracting the output transmission signal to produce a extracted transmission signal for each slot;

carrying out a wave detection of the extracted transmission signal to produce a resultant signal of the wave detection;

calculating for each slot an average error of the resultant signal of the level data signal;

correcting the level data signal with reference to the average error to produce a corrected level data signal as a newly level data signal; and adjusting the gain of the transmitter according to the newly level data signal to compensate for the transmission power control and to produce a gain compensated transmission signal as the output transmission signal.

29. A compensation method as claimed in claim 28, wherein the carrying out uses a logarithmic wave detector for the wave detection.

30. A compensation method as claimed in claim 28, wherein the calculating comprises:

detecting a median level of the resultant signal for each slot to produce a median signal; and subtracting the median level from the level data signal to obtain the average error.

* * * * *